(12) United States Patent
Kim et al.

(10) Patent No.: US 12,740,069 B2
(45) Date of Patent: Sep. 15, 2026

(54) SEMICONDUCTOR DEVICE

(71) Applicant: Samsung Electronics Co., Ltd., Suwon-si (KR)

(72) Inventors: Yongjae Kim, Suwon-si (KR); Woojin Kim, Suwon-si (KR); Junghoon Bak, Suwon-si (KR); Hyunchul Shin, Suwon-si (KR); Hyeonah Jo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 290 days.

(21) Appl. No.: 18/473,660

(22) Filed: Sep. 25, 2023

(65) Prior Publication Data

US 2024/0324243 A1 Sep. 26, 2024

(30) Foreign Application Priority Data

Mar. 20, 2023 (KR) ........................ 10-2023-0035885

(51) Int. Cl.
*H10B 61/00* (2023.01)
*H10W 20/42* (2026.01)

(52) U.S. Cl.
CPC ............ *H10B 61/22* (2023.02); *H10W 20/42* (2026.01)

(58) Field of Classification Search
CPC ......... H01L 27/14636; H01L 27/14621; H01L 27/14627; H01L 27/14629; H01L 27/14634; H01L 27/14643; H01L 27/1464; H01L 27/14641; H01L 27/1469; H01L 23/522; H01L 24/05; H01L 25/0657; H01L 27/1461; H01L 27/14612; H01L 27/14632; H10N 50/10
See application file for complete search history.

(56) References Cited

U.S. PATENT DOCUMENTS 7,919,794 B2 4/2011 Gu et al.
8,043,869 B2 10/2011 Cho et al.
(Continued)

FOREIGN PATENT DOCUMENTS

JP 2017059679 A 3/2017
KR 101148395 B1 5/2012

OTHER PUBLICATIONS

Takayuki Nozaki, et al. "Highly efficient voltage control of spin and enhanced interfacial perpendicular magnetic anisotropy in iridium-doped Fe/MgO magnetic tunnel juctions," NPG, Asia Materials, No. 9, e451 (2017).

*Primary Examiner* — Samuel Park
(74) *Attorney, Agent, or Firm* — HARNESS, DICKEY & PIERCE, P.L.C.

(57) ABSTRACT

A semiconductor device includes a plurality of data storage patterns on a substrate, the plurality of data storage patterns spaced apart from each other in a first direction parallel to an upper surface of the substrate, a first upper conductive line on the plurality of data storage patterns, extending in the first direction and connected to the plurality of data storage patterns, a second upper conductive line on the first upper conductive line and extending in the first direction and a plurality of via contacts between the first upper conductive line and the second upper conductive line and spaced apart from each other in the first direction. The plurality of via contacts are arranged to be offset from the plurality of data storage patterns in the first direction.

20 Claims, 13 Drawing Sheets

(56) References Cited

U.S. PATENT DOCUMENTS

| | | | | |
|---|---|---|---|---|
| 8,653,614 | B2 | 2/2014 | Ikeno et al. | |
| 9,704,919 | B1 | 7/2017 | Lu et al. | |
| 10,418,548 | B2 | 9/2019 | Han et al. | |
| 10,454,021 | B2 | 10/2019 | Sung et al. | |
| 10,686,125 | B2 | 6/2020 | Chuang et al. | |
| 10,777,737 | B2 | 9/2020 | Kim et al. | |
| 10,991,758 | B2 | 4/2021 | Chuang et al. | |
| 11,271,034 | B2 | 3/2022 | Guo | |
| 2005/0260773 | A1* | 11/2005 | Hong | H10B 61/00 257/E27.005 |
| 2017/0077177 | A1* | 3/2017 | Shimomura | G11C 11/18 |
| 2017/0222134 | A1 | 8/2017 | Annunziata et al. | |
| 2022/0384712 | A1* | 12/2022 | Huang | H10N 50/80 |
| 2023/0232638 | A1* | 7/2023 | Wang | H10N 50/10 257/421 |

* cited by examiner

FIG. 3

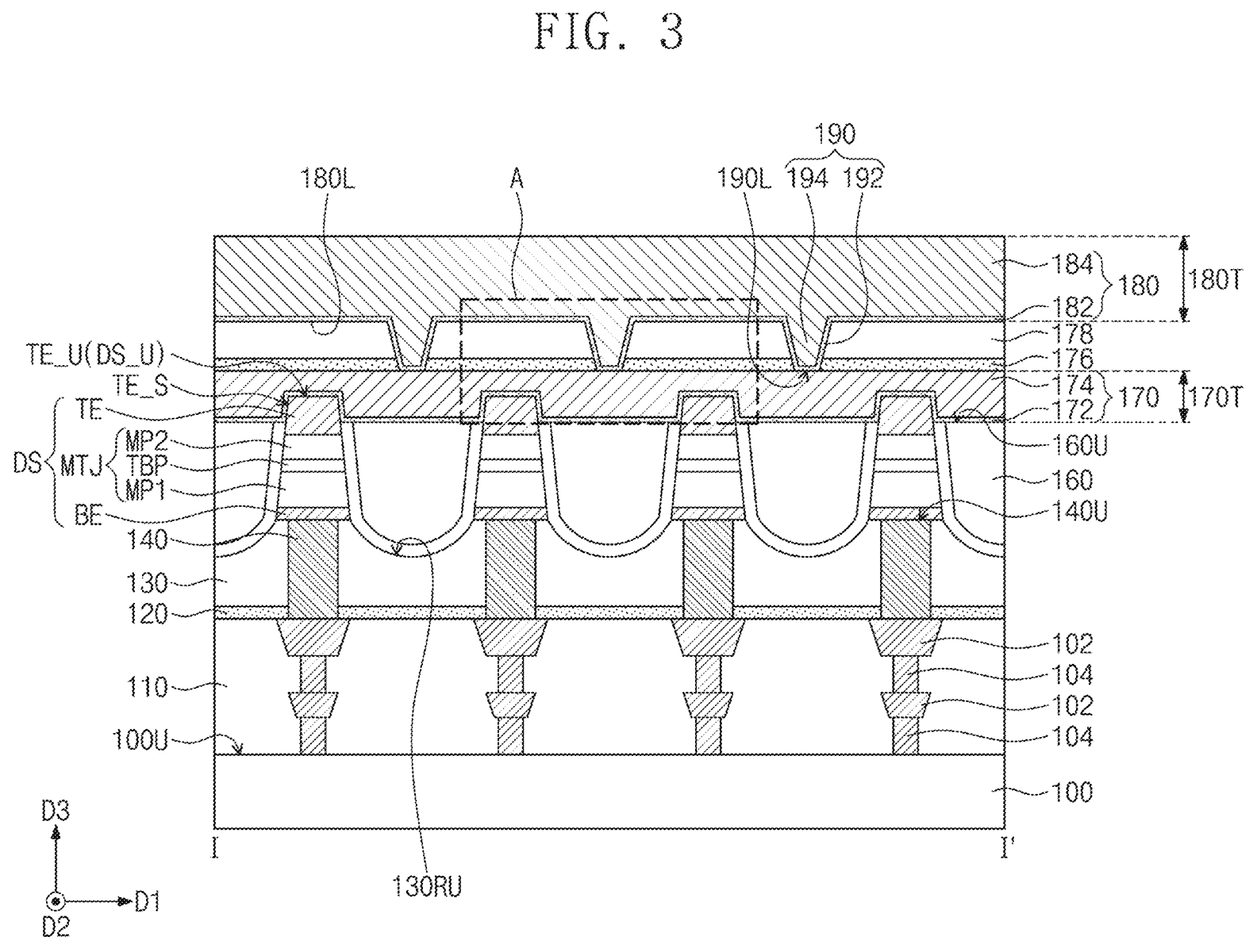

180T 170T 180 184 182 178 176 174 172 170 160U 160 140U 102 104 102 104 100 I'
190 192 194 190L A 180L 130RU
TE_U(DS_U) TE_S TE MP2 TBP MP1 MTJ BE DS 140 130 120 110 100U I
D1 D2 D3

160U
160
150
102
104
102
104
100
I'
T1
130RU
TE_U(DS_U)
TE_S
TE
MP2
TBP
MP1
MTJ
BE
DS
140
130
120
110
I
D3
D2
D1

SEMICONDUCTOR DEVICE

CROSS-REFERENCE TO RELATED APPLICATIONS

This U.S. non-provisional patent application claims priority under 35 U.S.C.§ 119 to Korean Patent Application No. 10-2023-0035885, filed on Mar. 20, 2023, in the Korean Intellectual Property Office, the entire contents of which are hereby incorporated by reference.

BACKGROUND

Various example embodiments relate to a semiconductor device and/or a method of manufacturing the same, and more particularly, relates to a semiconductor device including a magnetic tunnel junction and/or a method of manufacturing the same.

With the high speed and/or low power consumption of electronic devices, there is an increasing requirement or expectation for high speed and/or low operating voltage of semiconductor devices incorporated in an electronic device. To help to meet the requirement, magnetic memory devices have been proposed as semiconductor memory devices. Because magnetic memory devices may exhibit characteristics such as high-speed operation and/or non-volatility, they are being spotlighted as the next-generation semiconductor devices.

In general, a magnetic memory device may include a magnetic tunnel junction (MTJ) pattern. The MTJ pattern may include two magnetic substances and an insulating layer interposed therebetween. Resistance of the MTJ pattern may vary depending on magnetization directions of the two magnetic substances. For example, when the magnetization directions of the two magnetic substances are anti-parallel to each other, the MTJ pattern may have low resistance. Data may be written/read using the resistance difference.

According to various expectations within the electronics industry, various studies are being conducted on a semiconductor device having an embedded structure in which a magnetic tunnel junction pattern is disposed between metal wires.

SUMMARY

Various example embodiments may provide a semiconductor device that is more easily manufactured and is capable of being reducing or minimizing defects in a manufacturing process, and/or a manufacturing method thereof.

Alternatively or additionally, various example embodiments may provide a semiconductor device with improved electrical characteristics and/or a manufacturing method thereof.

A semiconductor device according to some example embodiments may include a plurality of data storage patterns on a substrate, the plurality of data storage patterns spaced apart from each other in a first direction parallel to an upper surface of the substrate, a first upper conductive line on the plurality of data storage patterns, extending in the first direction, and connected to the plurality of data storage patterns, a second upper conductive line extending in the first direction on the first upper conductive line, and a plurality of via contacts between the first upper conductive line and the second upper conductive line and spaced apart from each other in the first direction. The plurality of via contacts may be offset from the plurality of data storage patterns in the first direction.

Alternatively or additionally, a semiconductor device according to some example embodiments may include a first data storage pattern and a second data storage pattern spaced apart from each other on a substrate in a first direction parallel to an upper surface of the substrate, an upper insulating layer between the first data storage pattern and the second data storage pattern, a first upper conductive line on the upper insulating layer, extending in the first direction, and connected to the first and second data storage patterns, a second upper conductive line on the first upper conductive line extending in the first direction, and a via contact between the first upper conductive line and the second upper conductive line. A bottom surface of the via contact may at least partially overlap the upper insulating layer between the first data storage pattern and the second data storage pattern in a vertical direction perpendicular to the upper surface of the substrate.

BRIEF DESCRIPTION OF THE DRAWINGS

Various example embodiments will be more clearly understood from the following brief description taken in conjunction with the accompanying drawings. The accompanying drawings represent non-limiting, example embodiments as described herein.

FIG. 3 is a cross-sectional view taken along line I-I' of FIG. 2.

FIGS. 7 and 8 are cross-sectional views taken along I-I' and II-II' of FIG. 6, respectively.

DETAILED DESCRIPTION

Hereinafter, various inventive concepts will be described in detail by describing example embodiments thereof with reference to the accompanying drawings.

Figure 1:
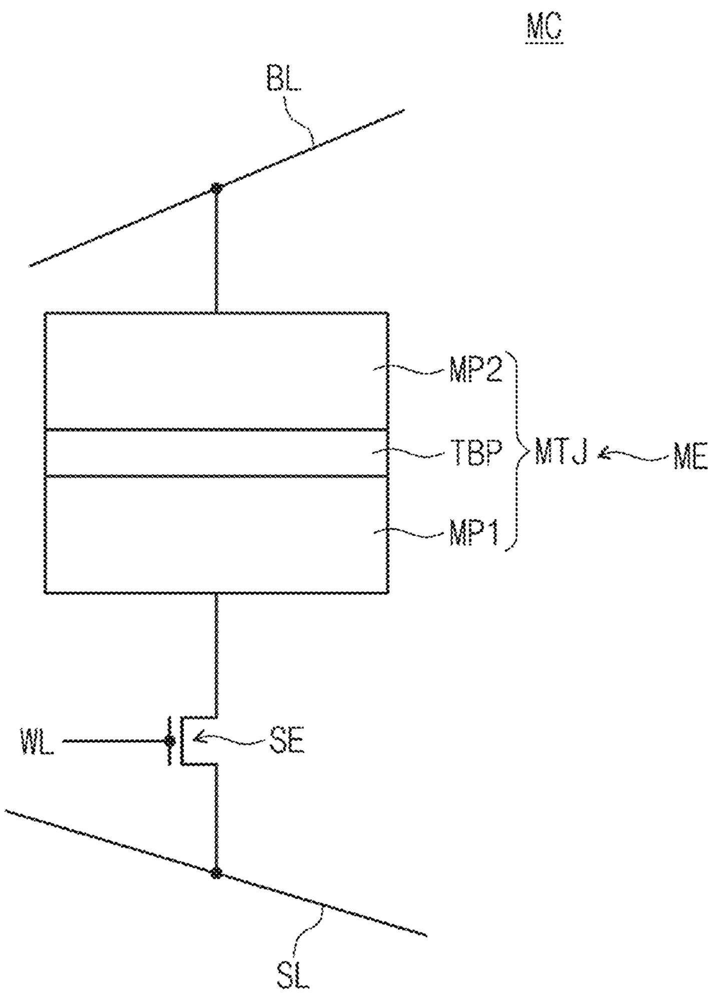
FIG. 1 is a circuit diagram illustrating a unit memory cell of a semiconductor device according to some example embodiments.

FIG. 1 is a circuit diagram illustrating a unit memory cell of a semiconductor device according to some example embodiments.

Referring to FIG. 1, a unit memory cell MC may include a memory element ME and a selection element SE. The memory element ME and the selection element SE may be electrically connected to each other in series. The memory element ME may be connected between a bit line BL and the selection element SE. The selection element SE may be connected between the memory element ME and a source line SL and may be controlled by a word line WL. The selection element SE may include, for example, a bipolar transistor such as an NPN and/or PNP transistor, and/or a MOS field effect transistor such as an NMOS and/or a PMOS transistor.

The memory element ME may include a magnetic tunnel junction pattern MTJ including magnetic patterns MP1 and MP2 that are spaced apart from each other, and a tunnel barrier pattern TBP between the magnetic patterns MP1 and MP2. One of the magnetic patterns MP1 and MP2 may be or may include or be included in a reference magnetic pattern having a magnetization direction fixed in one direction regardless of an external magnetic field under a normal use environment. Another of the magnetic patterns MP1 and MP2 may be or may include or be included in a free magnetic pattern in which a magnetization direction is changed between two stable magnetization directions by an external magnetic field. An electrical resistance of the magnetic tunnel junction pattern MTJ may be higher or much higher, e.g., one or more orders of magnitude higher, when magnetization directions of the reference magnetic pattern and the free magnetic pattern are antiparallel to each other than when magnetization directions are parallel to each other. For example, the electrical resistance of the magnetic tunnel junction pattern MTJ may be adjusted by changing the magnetization direction of the free magnetic pattern. Accordingly, the memory element ME may store data in the unit memory cell MC using a difference in electrical resistance depending on magnetization directions of the reference magnetic pattern and the free magnetic pattern. For example, a low resistance may be or correspond to a logical '0' (or, alternatively, a logical '1'), while a high resistance may be or correspond to a logical '1' (or, alternatively, a logical '0').

In some example embodiments, a row or word line WL may be connected to the selection element SE (e.g., to a gate of an NMOS transistor). In some example embodiments, the column or bit line BL may be connected to magnetic pattern MP2. In some example embodiments, a selection line SL may be connected to the selection element SE, e.g., to a source and/or a drain of the NMOS transistor; example embodiments are not limited thereto.

Figure 2:
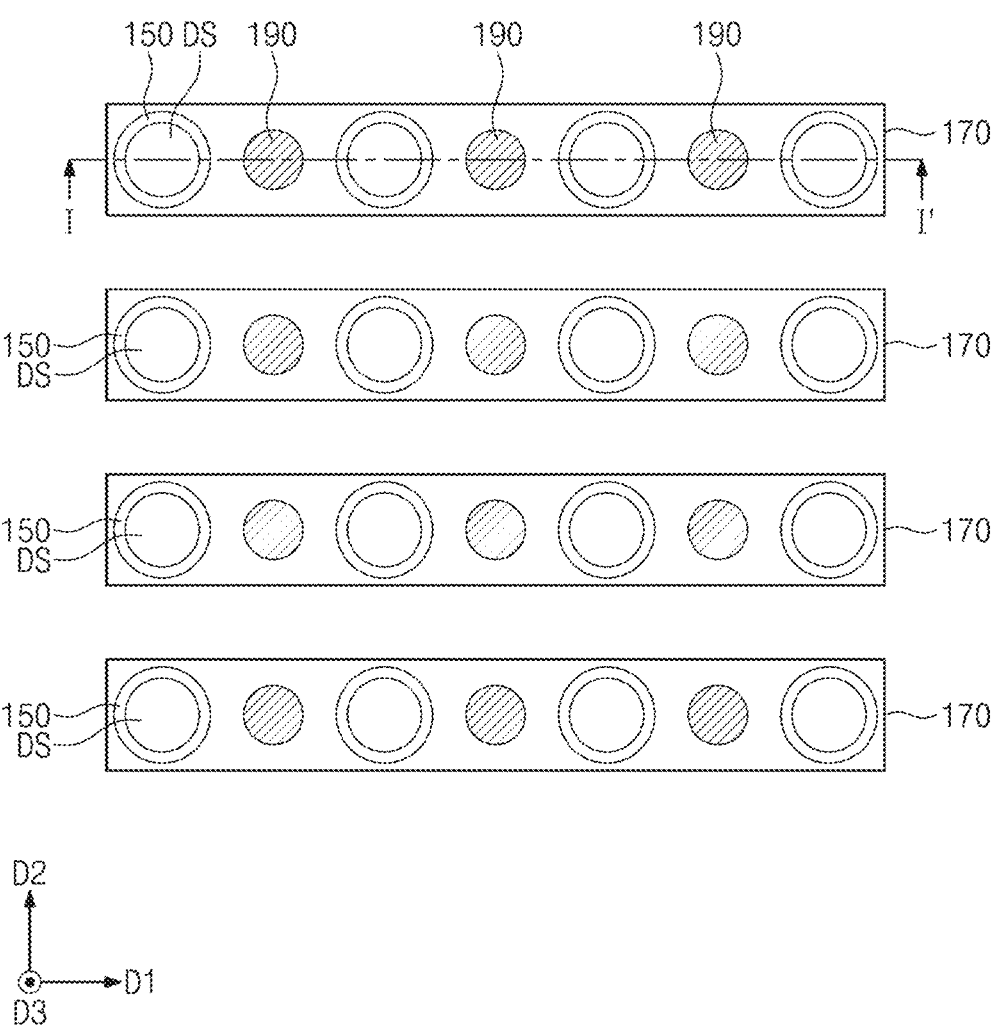
FIG. 2 is a plan view of a semiconductor device according to some example embodiments.
Figure 4A:
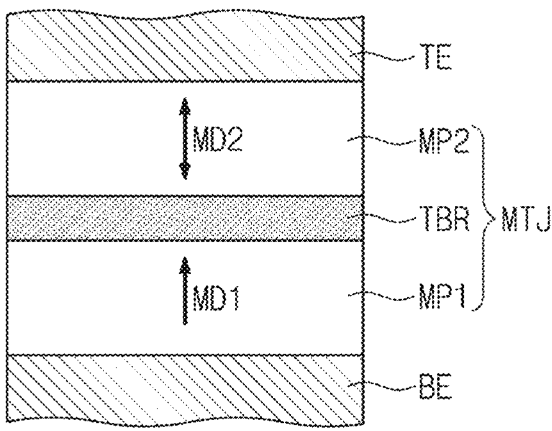
FIGS. 4A and 4B are cross-sectional views respectively illustrating examples of a magnetic tunnel junction pattern of FIG. 3.
Figure 4B:
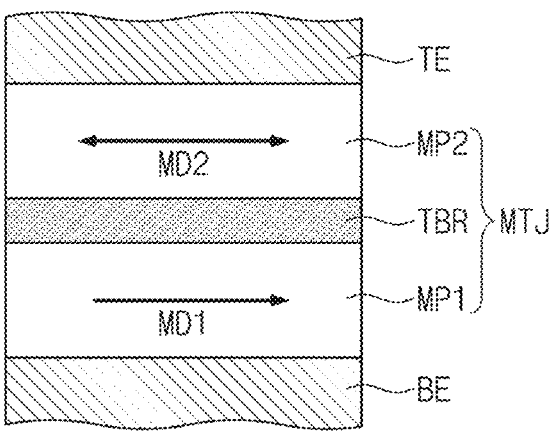
Figure 5:
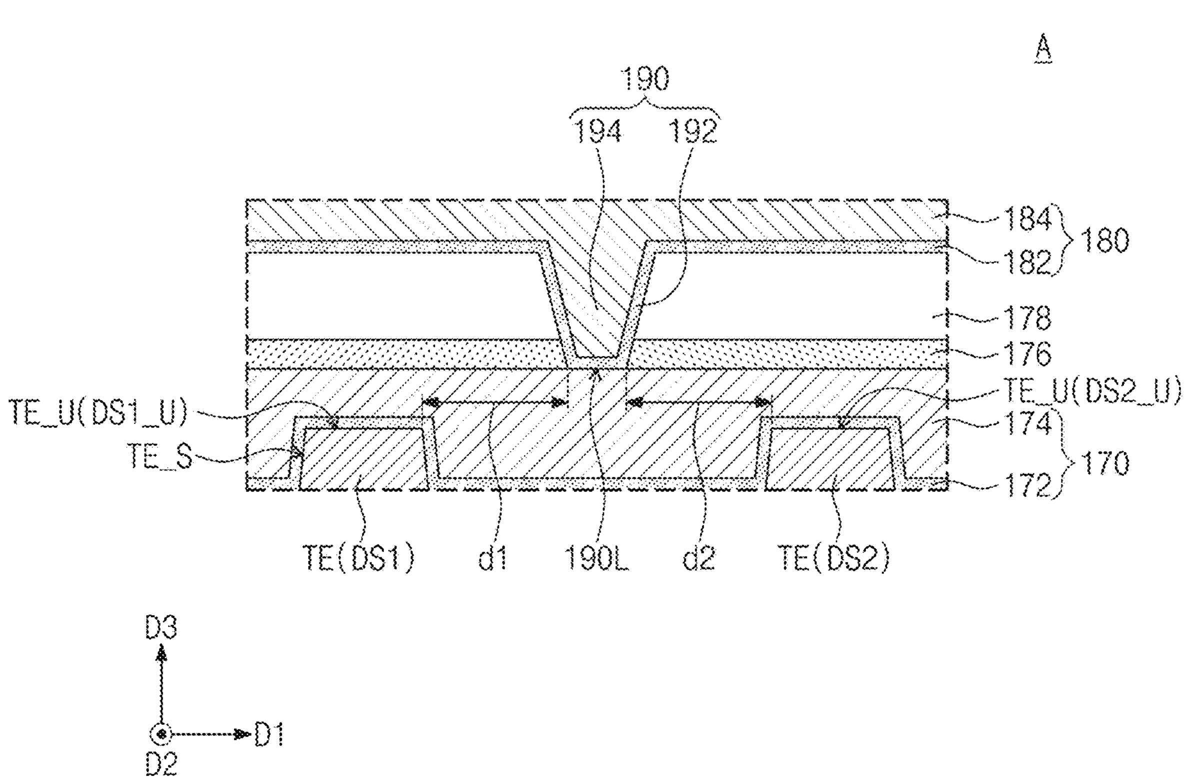
FIG. 5 is an enlarged view of portion 'A' of FIG. 3.

FIG. 2 is a plan view of a semiconductor device according to various example embodiments. FIG. 3 is a cross-sectional view taken along line I-I' of FIG. 2. FIGS. 4A and 4B are cross-sectional views respectively illustrating examples of a magnetic tunnel junction pattern of FIG. 3. FIG. 5 is an enlarged view of portion 'A' of FIG. 3. Referring to FIGS. 2 and 3, wiring structures 102 and 104 may be disposed on a substrate 100. The substrate 100 may be or include or be included in a semiconductor substrate including silicon (Si), silicon on insulator (SOI), silicon germanium (SiGe), germanium (Ge), gallium arsenide (GaAs), and/or the like. The wiring structures 102 and 104 may include wiring lines 102 vertically spaced apart from the substrate 100 and wiring contacts 104 connected to the wiring lines 102. The wiring lines 102 may be spaced apart from an upper surface 100U of the substrate 100 in a direction perpendicular to the upper surface 100U of the substrate 100. The wiring contacts 104 may be disposed between the substrate 100 and the wiring lines 102. Each of the wiring lines 102 may be electrically connected to the substrate 100 through a corresponding one of the wiring contacts 104. The wiring lines 102 and the wiring contacts 104 may include metal (e.g., copper and/or tungsten and/or aluminum).

Selection elements (corresponding, e.g., to SE in FIG. 1) may be disposed on the substrate 100 (not illustrated in FIGS. 2-5). The selection elements may be, include, or be included in, for example, field effect transistors. Each of the wiring lines 102 may be electrically connected to a terminal (e.g., a drain terminal and/or a source terminal) of a corresponding one of the selection elements through a corresponding one of the wiring contacts 104.

A wiring insulating layer 110, e.g., an interlay dielectric layer, may be disposed on the substrate 100 to cover the wiring structures 102 and 104. The wiring insulating layer 110 may expose upper surfaces of uppermost wiring lines 102 among the wiring lines 102. For example, the upper surface of the wiring insulating layer 110 may be substantially coplanar with the upper surfaces of the uppermost wiring lines 102. The wiring insulating layer 110 may include, for example, one or more of silicon oxide, silicon nitride, and/or silicon oxynitride. A first protective insulating layer 120 may be disposed on the wiring insulating layer 110 and may cover the exposed upper surfaces of the uppermost wiring lines 102. The first protective insulating layer 120 may include, for example, one or more of silicon oxide, silicon nitride, silicon oxynitride, and/or silicon carbon nitride. The first protective insulating layer 120 may or may not include any common element with the wiring insulating layer 110.

A lower insulating layer 130 may be disposed on the first protective insulating layer 120. The first protective insulating layer 120 may be interposed between the wiring insulating layer 110 and the lower insulating layer 130. The lower insulating layer 130 may include, for example, one or more of silicon oxide, silicon nitride, and/or silicon oxynitride. The lower insulating layer 130 may or may not include any common element with the first protective insulating layer 120.

Data storage patterns DS may be disposed on the lower insulating layer 130. The data storage patterns DS may be spaced apart from each other in a first direction D1 and a second direction D2 that are parallel to the upper surface 100U of the substrate 100 and cross each other. The lower insulating layer 130 may have a upper surface 130RU recessed toward the substrate 100 between the data storage patterns DS.

Lower electrode contacts 140 may be disposed in the lower insulating layer 130 and may be spaced apart from each other in the first direction D1 and the second direction D2. The lower electrode contacts 140 may be respectively disposed below the data storage patterns DS (e.g., closer to the substrate 110 than the data storage patterns DS) and may be electrically connected to the data storage patterns DS, respectively. Each of the lower electrode contacts 140 may pass through the lower insulating layer 130 and the first protective insulating layer 120 and may be electrically connected to a corresponding one of the uppermost wiring lines 102. Upper surfaces 140U of the lower electrode contacts 140 may be positioned at a height higher than the recessed upper surface 130RU of the lower insulating layer 130. As used herein, a height may be a distance measured from the upper surface 100U of the substrate 100 in a direction perpendicular to the upper surface 100U of the substrate 100 (e.g., a third direction D3). The lower electrode contacts 140 may include at least one of a doped semiconductor material (e.g., doped silicon such as doped polysilicon), a metal (e.g., tungsten, titanium, and/or tantalum), a metal-semiconductor compound (e.g., metal silicide), and a conductive metal nitride (e.g., titanium nitride, tantalum nitride, and/or tungsten nitride).

The data storage patterns DS may be respectively disposed on the lower electrode contacts 140 and electrically connected to the lower electrode contacts 140, respectively. Each of the data storage patterns DS includes a lower electrode BE, a magnetic tunnel junction pattern MTJ, and an upper electrode TE sequentially stacked on each of the lower electrode contacts 140 in the third direction D3. The lower electrode BE may be disposed between each of the lower electrode contacts 140 and the magnetic tunnel junction pattern MTJ, and the magnetic tunnel junction pattern MTJ may be disposed between the lower electrode BE and the upper electrodes TE. The magnetic tunnel junction pattern MTJ may include a first magnetic pattern MP1, a second magnetic pattern MP2, and a tunnel barrier pattern TBP therebetween (e.g., directly therebetween). The first magnetic pattern MP1 may be disposed between the lower electrode BE and the tunnel barrier pattern TBP, and the second magnetic pattern MP2 may be disposed between the upper electrode TE and the tunnel barrier pattern TBP. The lower electrode BE may include, for example, a conductive metal nitride (e.g., titanium nitride or tantalum nitride). The upper electrode TE may include at least one of a metal (e.g., one or more of Ta, W, Ru, Ir, etc.) and a conductive metal nitride (e.g., TiN).

Referring to FIGS. 4A and 4B, the first magnetic pattern MP1 may be or include or be included in a reference layer having a magnetization direction MD1 fixed in one direction, and the second magnetic pattern MP2 may be or may include or be included in a free layer having a magnetization direction MD2 changeable to be parallel or anti-parallel to the magnetization direction MD1 of the first magnetic pattern MP1. Referring to FIGS. 4A and 4B each show a case in which the second magnetic pattern MP2 is a free layer as an example, but inventive concepts are not limited thereto. Unlike FIGS. 4A and 4B, the first magnetic pattern MP1 may be a free layer and the second magnetic pattern MP2 may be a reference layer.

Referring to FIG. 4A, the magnetization directions MD1 and MD2 of the first magnetic pattern MP1 and the second magnetic pattern MP2 may be perpendicular to an interface the tunnel barrier pattern TBP and the second magnetic pattern MP2. In this case, each of the first magnetic pattern MP1 and the second magnetic pattern MP2 may include at least one of an intrinsic perpendicular magnetic substance and an extrinsic perpendicular magnetic substance. The intrinsic perpendicular magnetic substance may include a material having perpendicular magnetization characteristics even when there is no external factor such as an external magnetic field. The intrinsic perpendicular magnetic substance may include at least one of i) perpendicular magnetic substance (e.g., CoFeTb, CoFeGd, CoFeDy), ii) perpendicular magnetic substance having an L10 or $L1_0$ structure, iii) CoPt having a hexagonal close packed lattice structure, and iv) vertical magnetic structures. The perpendicular magnetic substance having the L10 structure may include at least one of FePt of L10 structure, FePd of L10 structure, CoPd of L10 structure, or CoPt of L10 structure. The perpendicular magnetic structure may include magnetic layers and non-magnetic layers that are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n ("n" is the number of stacking). The extrinsic perpendicular magnetic substance may include a material having intrinsic horizontal magnetization characteristics and perpendicular magnetization characteristics due to an external factor. For example, the extrinsic perpendicular magnetic substance may have the perpendicular magnetization characteristics due to magnetic anisotropy induced by making a junction of the first magnetic pattern MP1 (or the second magnetic pattern MP2) and the tunnel barrier pattern TBP. The extrinsic perpendicular magnetic substance may include, for example, CoFeB.

Referring to FIG. 4B, as another example, the magnetization directions MD1 and MD2 of the first magnetic pattern MP1 and the second magnetic pattern MP2 may be parallel to the interface the tunnel barrier pattern TBP and the second magnetic pattern MP2. In this case, each of the first magnetic pattern MP1 and the second magnetic pattern MP2 may include a ferromagnetic substance. The first magnetic pattern MP1 may further include an antiferromagnetic substance for fixing a magnetization direction of the ferromagnetic substance in the first magnetic pattern MP1.

Each of the first magnetic pattern MP1 and the second magnetic pattern MP2 may include a Co-based Heusler alloy. The tunnel barrier pattern TBP may include at least one of a magnesium (Mg) oxide layer, a titanium (Ti) oxide layer, an aluminum (Al) oxide layer, a magnesium-zinc (Mg—Zn) oxide layer, or a magnesium-boron (Mg—B) oxide layer.

Referring back to FIGS. 2 and 3, a capping insulating layer 150 may be disposed on the lower insulating layer 130, and may cover the recessed upper surface 130RU of the lower insulating layer 130. The capping insulating layer 150 may extend on a side surface of each of the data storage patterns DS, and may surround the side surface of each of the data storage patterns DS when viewed in a plan view. The capping insulating layer 150 may cover side surfaces of the lower electrode BE, the magnetic tunnel junction pattern MTJ, and the upper electrode TE, and may surround the side surfaces of lower electrode BE, magnetic tunnel junction pattern MTJ, and upper electrode TE when viewed in a plan view. The capping insulating layer 150 may include nitride (e.g., silicon nitride).

An upper insulating layer 160 may be disposed on the lower insulating layer 130 and may cover (e.g., fully or at least partially cover) the data storage patterns DS. The upper insulating layer 160 may fill a space between the data storage patterns DS. The capping insulating layer 150 may be interposed between the side surface of each of the data storage patterns DS and the upper insulating layer 160, and may extend between the recessed upper surface 130RU of the lower insulating layer 130 and the upper insulating layer 160. The upper insulating layer 160 may include, for example, silicon oxide, silicon nitride, and/or silicon oxynitride.

According to some example embodiments, an upper portion of the upper electrode TE may protrude from an upper surface 160U of the upper insulating layer 160. An upper surface TE_U of the upper electrode TE may be positioned at a higher level than the upper surface 160U of the upper insulating layer 160. An upper side surface TE_S of the upper electrode TE may not be covered by the upper insulating layer 160 and the capping insulating layer 150. The upper insulating layer 160 and the capping insulating layer 150 may expose the upper side surface TE_S of the upper electrode TE.

A first upper conductive line 170 may be disposed on the upper insulating layer 160 and may extend in the first direction D1. The first upper conductive line 170 may be connected to corresponding data storage patterns DS spaced apart from each other in the first direction D1. The first upper conductive lines 170 may be provided in plurality, and the plurality of first upper conductive lines 170 may extend in the first direction D1 and be spaced apart from each other in the second direction D2. Each of the plurality of first upper conductive lines 170 may be connected to the corresponding data storage patterns DS spaced apart from each other in the first direction D1. In some example embodiments, the first upper conductive line 170 may correspond to at least a portion of the bit line BL referred to in FIG. 1; however, example embodiments are not limited thereto.

The first upper conductive line 170 may be connected to the upper electrode TE of each of the corresponding data storage patterns DS. According to some example embodiments, the first upper conductive line 170 may cover the upper surface TE_U and the upper side surface TE_S of the upper electrode TE, and may be in contact with the upper surface TE_U and the upper side surface TE_S of the upper electrode TE. The first upper conductive line 170 may cover the upper surface 160U of the upper insulating layer 160 between the corresponding data storage patterns DS, and may be in contact with the upper surface 160U of the upper insulating layer 160.

The first upper conductive line 170 may include a first conductive pattern 174 extending in the first direction D1, and a first barrier pattern 172 extending along the bottom surface of the first conductive pattern 174. The first barrier pattern 172 may be interposed between the upper surface TE_U of the upper electrode TE and the first conductive pattern 174 and between the upper side surface TE_S of the upper electrode TE and the first conductive pattern 174, and may extend between the upper surface 160U of the upper insulating layer 160 and the first conductive pattern 174. The first conductive pattern 174 may include a metal (e.g., at least one of copper, tungsten, or aluminum), and the first barrier pattern 172 may include a conductive metal nitride.

A second protective insulating layer 176 and an upper interlayer insulating layer 178 may be sequentially stacked on the first upper conductive line 170. The second protective insulating layer 176 may be interposed between the first upper conductive line 170 and the upper interlayer insulating layer 178. The second protective insulating layer 176 may include, for example, silicon oxide, silicon nitride, silicon oxynitride, and/or silicon carbon nitride. The upper interlayer insulating layer 178 may include, for example, silicon oxide, silicon nitride, and/or silicon oxynitride, and may or may not include the same material as that of the first upper protective insulating layer 178.

A second upper conductive line 180 may be disposed on the upper interlayer insulating layer 178 and may extend in the first direction D1. A plurality of via contacts 190 may be disposed within the upper interlayer insulating layer 178 and between the first upper conductive line 170 and the second upper conductive line 180. The plurality of via contacts 190 may be spaced apart from each other in the first direction D1 along bottom surface 180L of the second upper conductive line 180. Each of the plurality of via contacts 190 may pass through the upper interlayer insulating layer 178 and the second protective insulating layer 176, and may be connected to the first upper conductive line 180 and the second upper conductive line 180. The second upper conductive line 180 may be electrically connected to the first upper conductive line 180 through the plurality of via contacts 190.

In some example embodiments, the second upper conductive line 180 may correspond to at least another portion of the bit line referred to in FIG. 1; however, example embodiments are not limited thereto. For example, in some example embodiments, the first upper conductive line 170 and the second upper conductive line 180 may be parallel electrical runners that correspond to two components of one bit line; but example embodiments are not limited thereto.

In some example embodiments, the via contacts 190 may be homogenous with, e.g., may be formed or filled at the same time as, e.g., may be filled with a common damascene process as, the second upper conductive lines 180.

The second upper conductive lines 180 may be provided in plurality, and the plurality of second upper conductive lines 180 may extend in the first direction D1 and be spaced apart from each other in the second direction D2. The plurality of second upper conductive lines 180 may be respectively disposed on the plurality of first upper conductive lines 170 and electrically connected to the plurality of first upper conductive lines 170, respectively. The plurality of via contacts 190 may be disposed below each of the plurality of second upper conductive lines 180. Each of the plurality of second upper conductive lines 180 may be electrically connected to each of the plurality of first upper conductive lines 170 through the plurality of via contacts 190.

The second upper conductive line 180 may include a second conductive pattern 184 extending in the first direction D1 and a second barrier pattern 182 extending along the bottom surface of the second conductive pattern 184. The second barrier pattern 182 may be interposed between the second conductive pattern 184 and the upper interlayer insulating layer 178. The second conductive pattern 184 may include a metal (e.g., at least one of copper, tungsten, or aluminum), and the second barrier pattern 182 may include a conductive metal nitride. The first conductive pattern 174 and the second conductive pattern 184 may include the same, or different, materials.

Each of the plurality of via contacts 190 may include a contact pattern 194 passing through the upper interlayer insulating layer 178 and the second protective insulating layer 176 and a contact barrier pattern 192 extending along a side surface and bottom surface of the contact pattern 194. The contact barrier pattern 192 may be interposed between the side surface of the contact pattern 194 and the upper interlayer insulating layer 178 and between the side surface of the contact pattern 194 and the second protective insulating layer 176, and may extend between the bottom surface of the contact pattern 194 and the first upper conductive line 170 (e.g., the first conductive pattern 174).

The contact pattern 194 may be in contact with the second conductive pattern 184 of the second upper conductive line 180. The contact pattern 194 may include metal (e.g., one or more of copper, tungsten, or aluminum), and may include, for example, the same material as the second conductive pattern 184. The contact pattern 194 and the second conductive pattern 184 may be integrally connected to each other without a boundary; example embodiments are not limited thereto. The contact barrier pattern 192 may be in contact with the second barrier pattern 182 of the second upper conductive line 180. The contact barrier pattern 192 may include conductive metal nitride, and for example, may include the same material as the second barrier pattern 182. The contact barrier pattern 192 and the second barrier pattern 182 may be integrally connected to each other without a boundary.

The plurality of via contacts 190 may be offset in the first direction D1 from the corresponding data storage patterns DS spaced apart from each other in the first direction D1. When viewed in a plan view, each of the plurality of via contacts 190 may be disposed between a pair of data storage patterns DS adjacent to each other in the first direction D1 among the corresponding data storage patterns DS (e.g., in a center between the pair of data storage patterns DS). Each of the plurality of via contacts 190 may be disposed on the first upper conductive line 170 between the pair of data storage patterns DS. Bottom surfaces 190L of the plurality of via contacts 190 may be spaced apart from upper surfaces DS_U of the corresponding data storage patterns DS in the first direction D1. The bottom surfaces 190L of the plurality of via contacts 190 may not overlap upper surfaces DS_U of the corresponding data storage patterns DS in the third direction D3. Each of upper surfaces DS_U of the corresponding data storage patterns DS may correspond to the upper surface TE_U of the upper electrode TE.

Referring to FIGS. 3 and 5, the pair of data storage patterns DS may include a first data storage pattern DS1 and a second data storage pattern DS2 immediately adjacent to each other in the first direction D1. A bottom surface 190L of each of or at least one of the plurality of via contacts 190 may be spaced apart from an upper surface DS1_U of the first data storage pattern DS1 by a first distance d1 in the first direction D1 and may be spaced apart from an upper surface DS2_U of the second data storage pattern DS2 by a second distance d2 in a direction opposite to the first direction D1. The upper surface DS1_U of the first data storage pattern DS1 may correspond to the upper surface TE_U of the upper electrode TE of the first data storage pattern DS1, and the upper surface DS2_U of the second data storage pattern DS2 may correspond to the upper surface TE_U of the upper electrode TE of the second data storage pattern DS2. Each of the first distance d1 and the second distance d2 may be greater than zero. For example, the first distance d1 and the second distance d2 may be equal to each other. As another example, the first distance d1 and the second distance d2 may be different from each other, e.g., the first distance d1 may be greater than or less than d2.

The bottom surface 190L of each of the plurality of via contacts 190 may not overlap the upper surface DS1_U of the first data storage pattern DS1 and the upper surface DS2_U of the second data storage pattern DS2 in the third direction D3. The bottom surface 190L of each of the plurality of via contacts 190 may overlap the upper insulating layer 160 between the first and second data storage patterns DS1 and DS2 in the third direction D3. The bottom surface 190L of each of the plurality of via contacts 190 may overlap the recessed upper surface 130RU of the lower insulating layer 130 in the third direction D3.

Referring back to FIGS. 2 and 3, each of the first upper conductive line 170 and the second upper conductive line 180 may have a thickness in the third direction D3. A first thickness 170T of the first upper conductive line 170 in the third direction D3 may be smaller than a second thickness 180T of the second upper conductive line 180 in the third direction D3.

Each of the plurality of via contacts 190 may be formed in a via hole penetrating the upper interlayer insulating layer 178 and the second protective insulating layer 176, and the via hole may expose a upper surface of the first upper conductive line 170. When the plurality of via contacts 190 overlap or at least partially overlap the data storage patterns DS in the third direction D3, the first upper conductive line 170 may be recessed and the upper electrode TE may be etched during an etching process for forming the via hole. Accordingly, various defects of the data storage patterns DS may occur.

According to various example embodiments, however, the plurality of via contacts 190 may be disposed to be offset from the data storage patterns DS in a horizontal direction (e.g., in the first direction D1 or the second direction D2) parallel to the upper surface 100U of the substrate 100. The bottom surfaces 190L of the plurality of via contacts 190 may not overlap the upper surfaces DS_U of the data storage patterns DS in a vertical direction (e.g., the third direction D3) perpendicular to the upper surface 100U of the substrate 100. Accordingly, even when the first upper conductive line 170 is recessed during forming the via holes in which the plurality of via contacts 190 are formed, the upper electrode TE of each of the data storage patterns DS may not be etched. As a result, defects of the data storage patterns DS may be prevented or reduced in likelihood of occurrence. Accordingly, a semiconductor device including the data storage patterns DS may be more easily manufactured, and defects of the semiconductor device may be reduced or minimized.

Alternatively or additionally, the first upper conductive line 170, the second upper conductive line 180, and the plurality of via contacts 190 may configure the bit line BL of FIG. 1. In this case, as the bit line BL includes the first upper conductive line 170 and the second upper conductive line 180 connected in parallel to each other, resistance of the bit line BL may be reduced. Accordingly, electrical characteristics of the semiconductor device may be improved.

Figure 6:
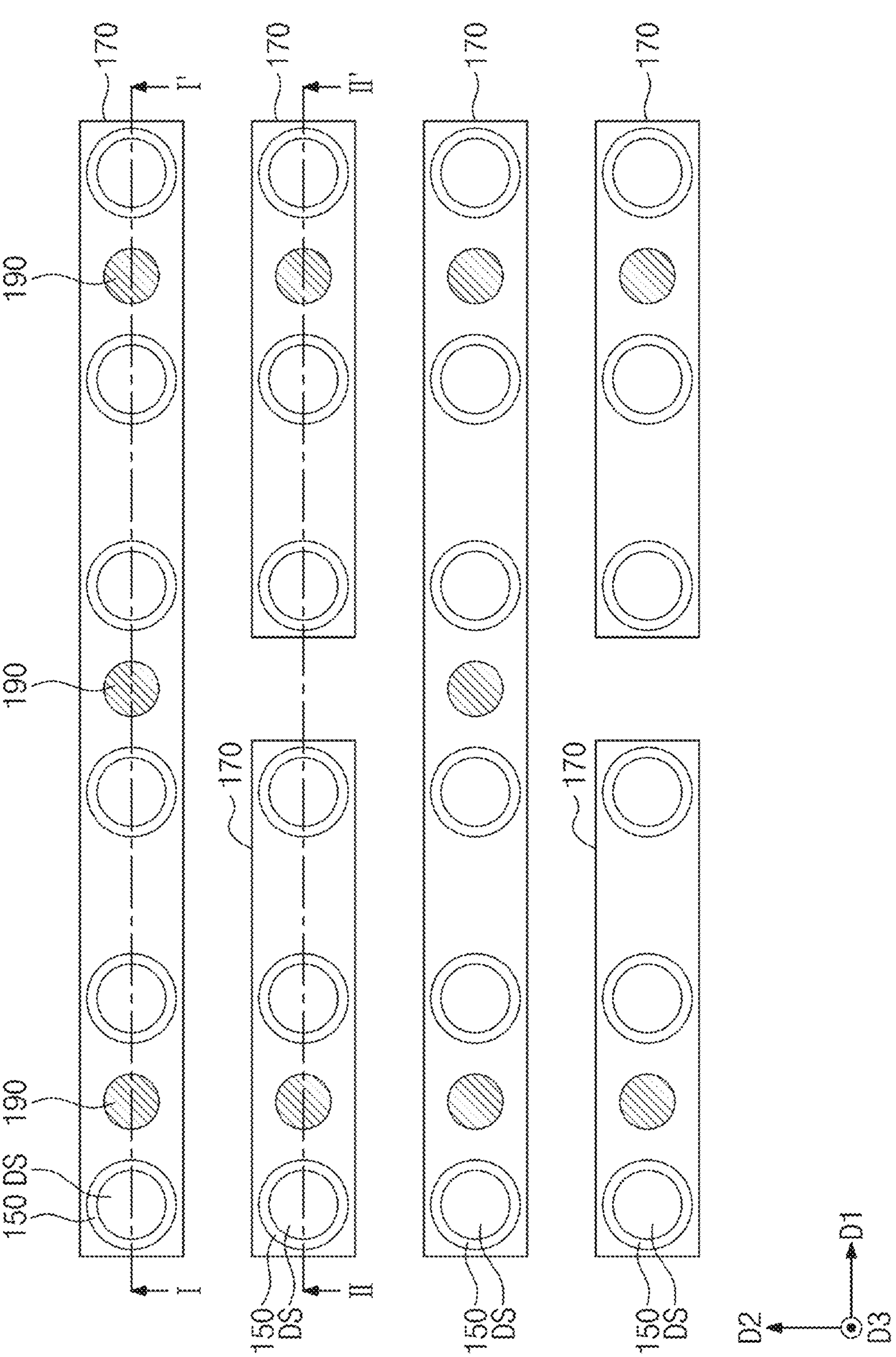
FIG. 6 is a plan view of a semiconductor device according to some example embodiments.
Figure 7:
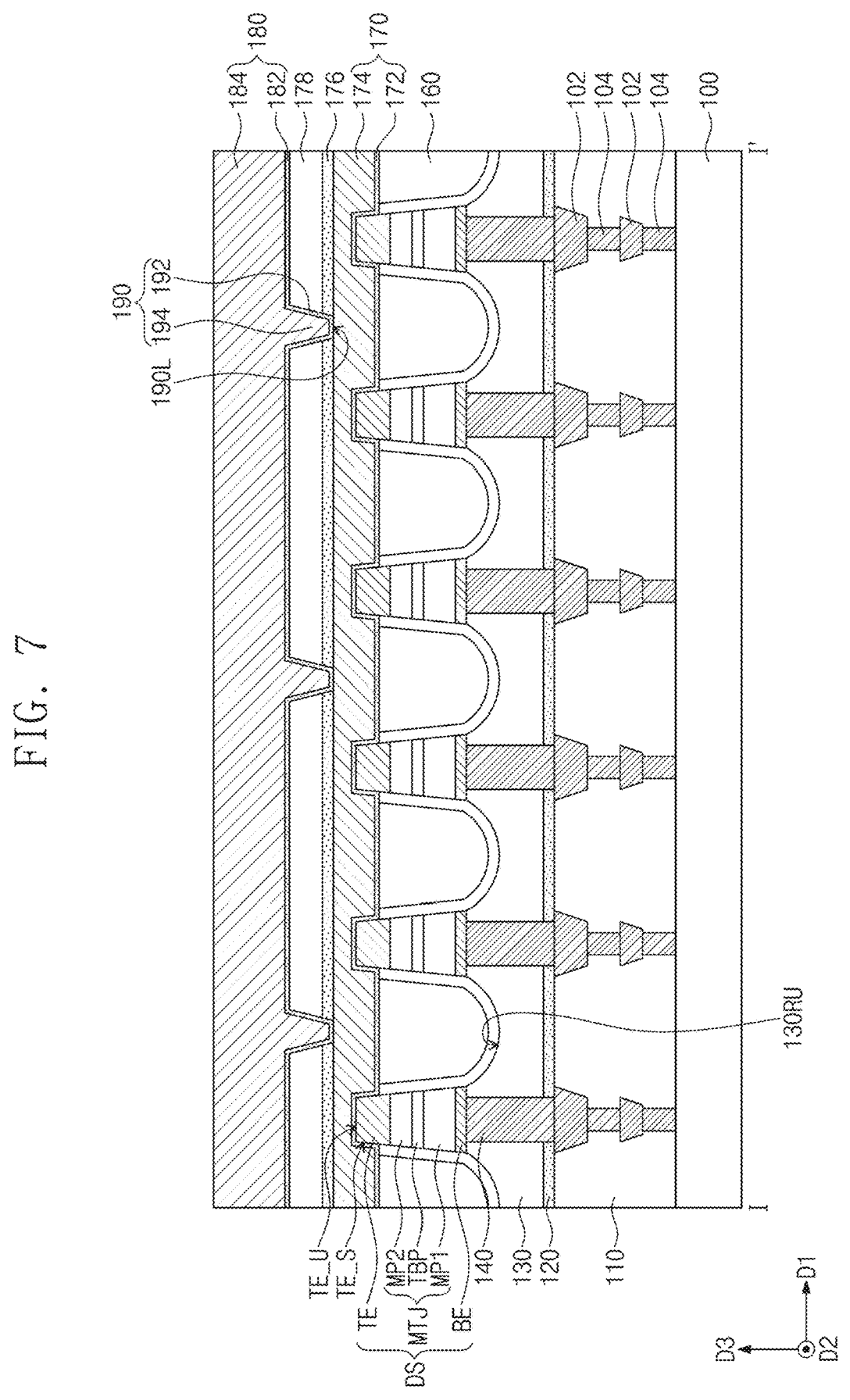
Figure 8:
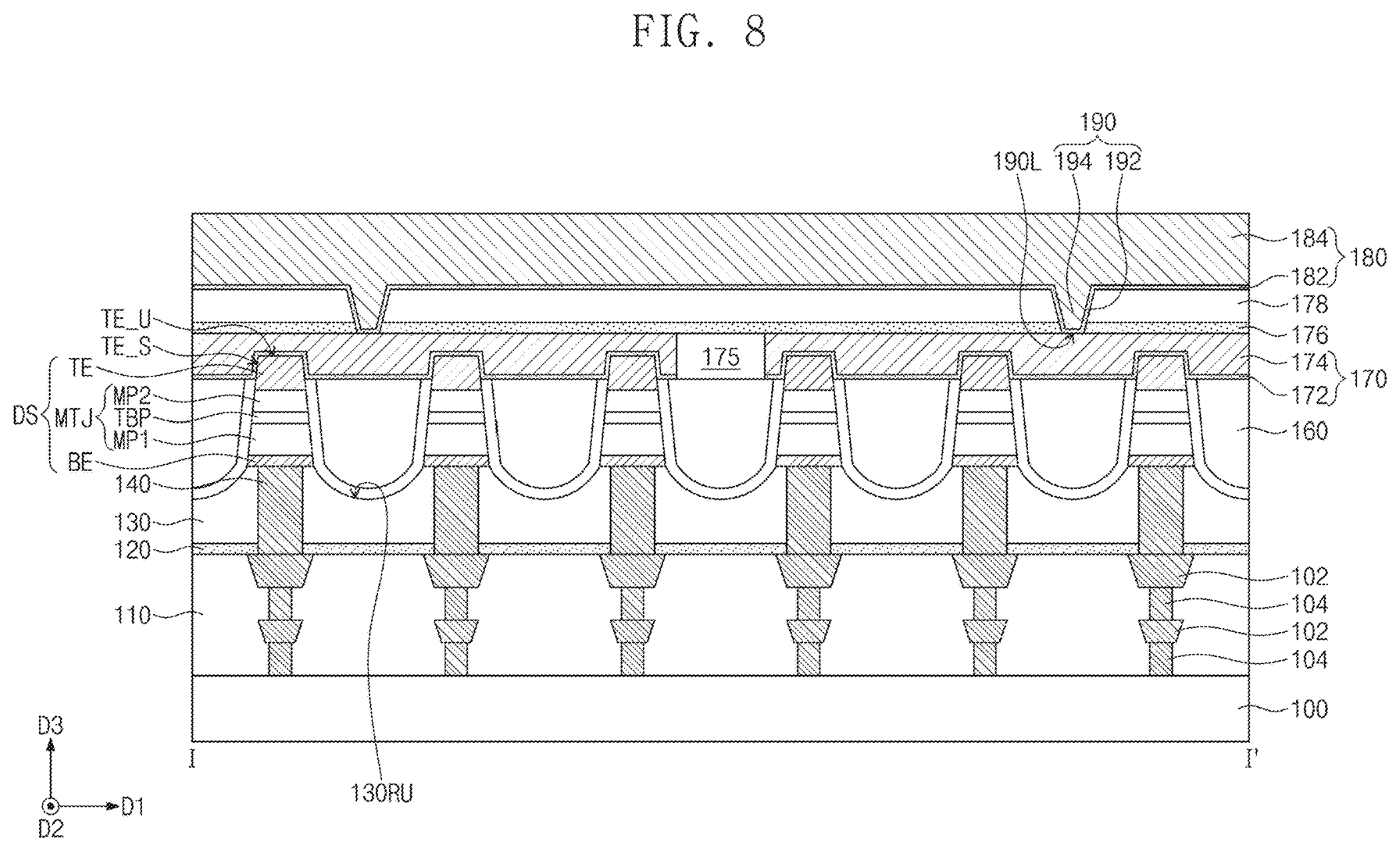

FIG. 6 is a plan view of a semiconductor device according to some example embodiments. FIGS. 7 and 8 are cross-sectional views taken along I-I' and II-II' of FIG. 6, respectively. For simplicity of description, differences from the semiconductor device described with reference to FIGS. 1 to 5 will be mainly described.

Referring to FIGS. 6, 7, and 8, each of the plurality of via contacts 190 may be disposed on the first upper conductive line 170 between a pair of data storage patterns DS immediately adjacent to each other in the first direction D1. Each of the plurality of via contacts 190 may not be provided on the first upper conductive line 170 between another pair of data storage patterns DS immediately adjacent to each other in the first direction D1.

Referring to FIGS. 6 and 8, at least one of the plurality of first upper conductive lines 170 may include a pair of first upper conductive lines 170 spaced apart from each other in the first direction D1. Each of the pair of first upper conductive lines 170 may be connected to corresponding data storage patterns DS spaced apart from each other in the first direction D1. At least one via contact 190 may be disposed on each of the pair of first upper conductive lines 170. The at least one via contact 190 may vertically (e.g., in the third direction D3) overlap the upper insulating layer 160 between a pair of data storage patterns DS immediately adjacent to each other in the first direction D1 among the corresponding data storage patterns DS.

An insulating pattern 175 may be disposed between the pair of first upper conductive lines 170 and on the upper insulating layer 160. The pair of first upper conductive lines 170 may be separated from each other by the insulating pattern 175. The insulating pattern 175 may be in contact with the upper surface 160U of the upper insulating layer 160. The insulating pattern 175 may include, for example, silicon oxide, silicon nitride, and/or silicon oxynitride.

The second protective insulating layer 176 and the upper interlayer insulating layer 178 may cover the pair of first upper conductive lines 170 and the insulating pattern 175. The second protective insulating layer 176 may be interposed between each of the pair of first upper conductive lines 170 and the upper interlayer insulating layer 178, and may be interposed between the insulating pattern 175 and the upper interlayer insulating layer 178.

Except for the above-mentioned difference, the semiconductor device according to some embodiments is substantially the same as the semiconductor device described with reference to FIGS. 1 to 5.

FIGS. 9 to 13 are views illustrating a method of manufacturing a semiconductor device according to some example embodiments, and are cross-sectional views corresponding to line I-I' of FIG. 2. For simplicity of description, descriptions overlapping with those of the semiconductor device described with reference to FIGS. 1 to 5 will be omitted.

Figure 9:
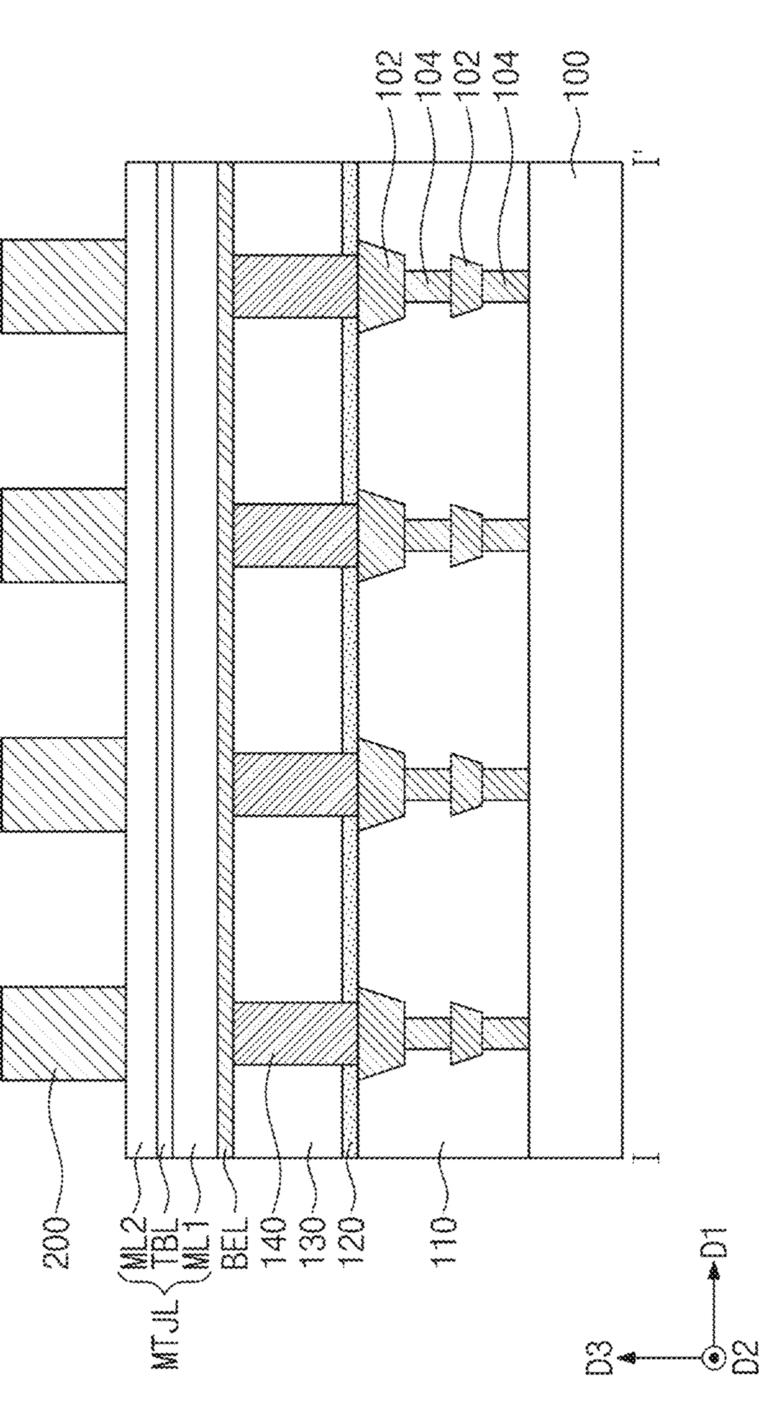
FIGS. 9 to 13 are views illustrating a method of manufacturing a semiconductor device according to some example embodiments, and are cross-sectional views corresponding to line I-I' of FIG. 2.

Referring to FIG. 9, selection elements (SE of FIG. 1) and/or word lines (WL of FIG. 1) and/or select lines (SL of FIG. 1) may be formed on a substrate 100, and wiring structures 102 and 104 may be formed on the selection elements. The wiring structures 102 and 104 may include wiring lines 102 and wiring contacts 104 connected to the wiring lines 102. Each of the wiring lines 102 may be electrically connected to a terminal (e.g., a drain terminal and/or a source terminal) of a corresponding one of the selection elements through a corresponding one of the wiring contacts 104. A wiring insulating layer 110 may be formed on the substrate 100 and may cover the wiring structures 102 and 104. The wiring insulating layer 110 may expose upper surfaces of the wiring lines 102 of an uppermost one among the wiring lines 102.

A first protective insulating layer 120 may be formed on the wiring insulating layer 110. The first protective insulating layer 120 may cover the exposed upper surfaces of the uppermost wiring lines 102. A lower insulating layer 130 may be formed on the first protective insulating layer 120.

Lower electrode contacts 140 may be formed in the lower insulating layer 130. Each of the lower electrode contacts 140 may pass through the lower insulating layer 130 and the first protective insulating layer 120 and may be connected to one of the uppermost wiring lines 102. Forming the lower electrode contacts 140 may include, for example, forming lower contact holes penetrating the lower insulating layer 130 and the first protective insulating layer 120, forming a lower contact layer filling the lower contact holes on the lower insulating layer 130, and planarizing the lower contact layer until an upper surface of the lower insulating layer 130 is exposed. Each of the lower contact holes may expose an upper surface of one of the uppermost wiring lines 102. Through the planarization process, the lower electrode contacts 140 may be locally formed in the lower contact holes, respectively.

A lower electrode layer BEL and a magnetic tunnel junction layer MTJL may be sequentially formed on the lower insulating layer 130. In some example embodiments, the magnetic tunnel junction layer MTJL may include a first magnetic layer ML1, a tunnel barrier layer TBL, and a second magnetic layer ML2 sequentially stacked on the lower electrode layer BEL. The lower electrode layer BEL and the magnetic tunnel junction layer MTJL may be formed by, for example, one or more of sputtering, chemical vapor deposition, or atomic layer deposition.

Conductive mask patterns 200 may be formed on the magnetic tunnel junction layer MTJL. The conductive mask patterns 200 may define regions where magnetic tunnel junction patterns, which will be described later, are to be formed. The conductive mask patterns 200 may include at least one of a metal (e.g., at least one of Ta, W, Ru, Ir, etc.) and a conductive metal nitride (e.g., TiN).

Figure 10:
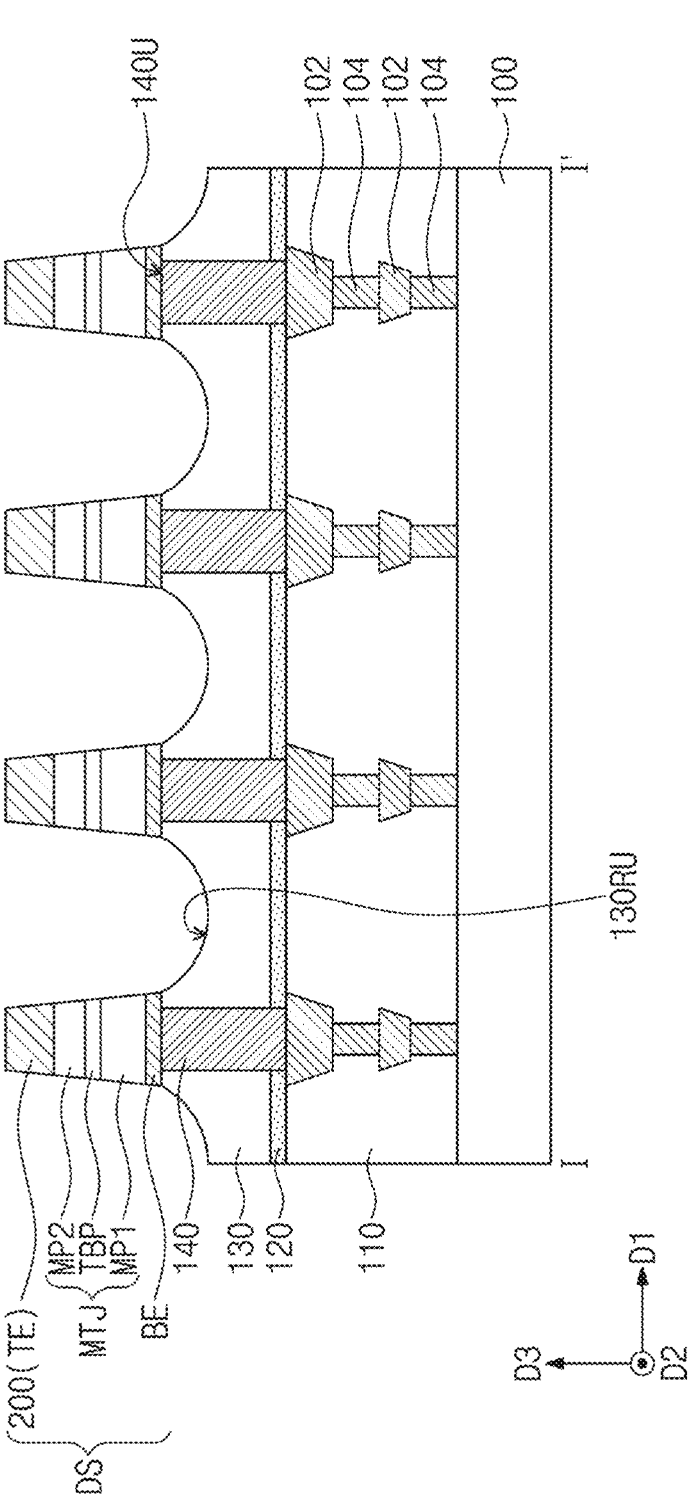

Referring to FIG. 10, the magnetic tunnel junction layer MTJL and the lower electrode layer BEL may be sequentially etched using the conductive mask patterns 200 as an etch mask. Accordingly, magnetic tunnel junction patterns MTJ and lower electrodes BE may be formed on the lower insulating layer 130. The lower electrodes BE may be respectively formed on the lower contact plugs 140 and may be respectively connected to the lower contact plugs 140. The magnetic tunnel junction patterns MTJ may be respectively formed on the lower electrodes BE.

The magnetic tunnel junction layer MTJL may include sequentially etching the second magnetic layer ML2, the tunnel barrier layer TBL, and the first magnetic layer ML1 using the conductive mask patterns 200 as an etching mask. Accordingly, each of the magnetic tunnel junction patterns MTJ may include a first magnetic pattern MP1, a tunnel barrier pattern TBP, and a second magnetic pattern MP2 sequentially stacked on the corresponding lower electrode BE.

The etching process of etching the magnetic tunnel junction layer MTJL and the lower electrode layer BEL may be, for example, an ion beam etching process using an ion beam. The ion beam may include inert ions such as but not limited to inert argon. An upper surface of the lower insulating layer 130 between the magnetic tunnel junction patterns MTJ may be recessed by the ion beam etching process. Accordingly, the lower insulating layer 130 may have a upper surface 130RU recessed between the magnetic tunnel junction patterns MTJ. The recessed upper surface 130RU of the lower insulating layer 130 may be positioned at a height lower than upper surfaces 140U of the lower electrode contacts 140.

After the ion beam etching process, remaining portions of the conductive mask patterns 200 may remain on the magnetic tunnel junction patterns MTJ, respectively. The remaining portions of the conductive mask patterns 200 may function as upper electrodes TE. Hereinafter, the remaining portions of the conductive mask patterns 200 may be referred to as upper electrodes TE. The upper electrodes TE, the magnetic tunnel junction patterns MTJ, and the lower electrodes BE may form data storage patterns DS. Each of the data storage patterns DS may include a lower electrode BE, a magnetic tunnel junction pattern MTJ, and an upper electrode TE sequentially stacked in the third direction D3. The data storage patterns DS may be respectively formed on the lower contact plugs 140.

Figure 11:
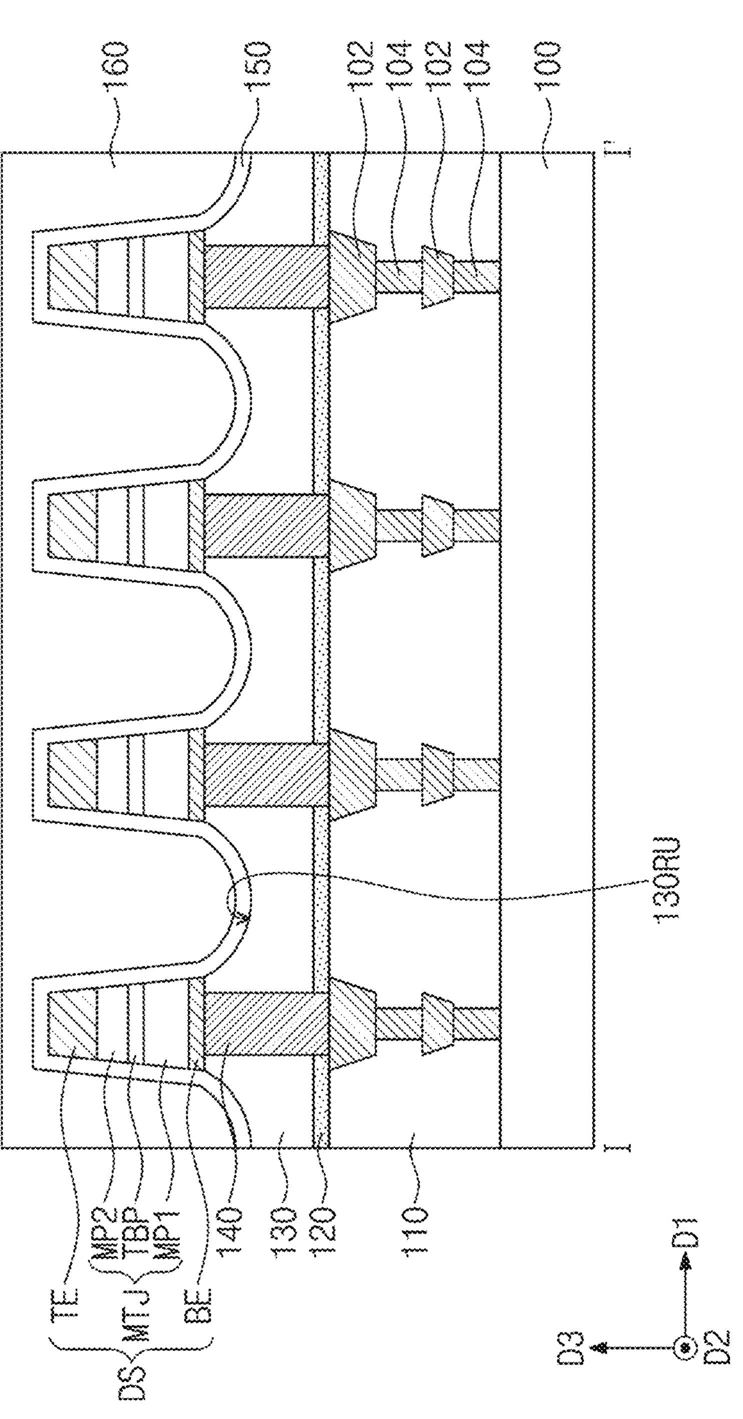

Referring to FIG. 11, a capping insulating layer 150 may be formed on the lower insulating layer 130 to cover the data storage patterns DS. The capping insulating layer 150 may be formed to cover (e.g., conformally cover) upper and side surfaces of each of the data storage patterns DS and extend along the recessed upper surface 130RU of the lower insulating layer 130. An upper insulating layer 160 may be formed on the capping insulating layer 150. The upper insulating layer 160 may cover the recessed upper surface 130RU of the lower insulating layer 130 and may fill a space between the data storage patterns DS. The capping insulating layer 150 may be interposed between the recessed upper surface 130RU of the lower insulating layer 130 and the upper insulating layer 160, and may extend between each side of the data storage patterns DS and the upper insulating layer 160 and between the upper surface of each of the data storage patterns DS and the upper insulating layer 160.

Figure 12:
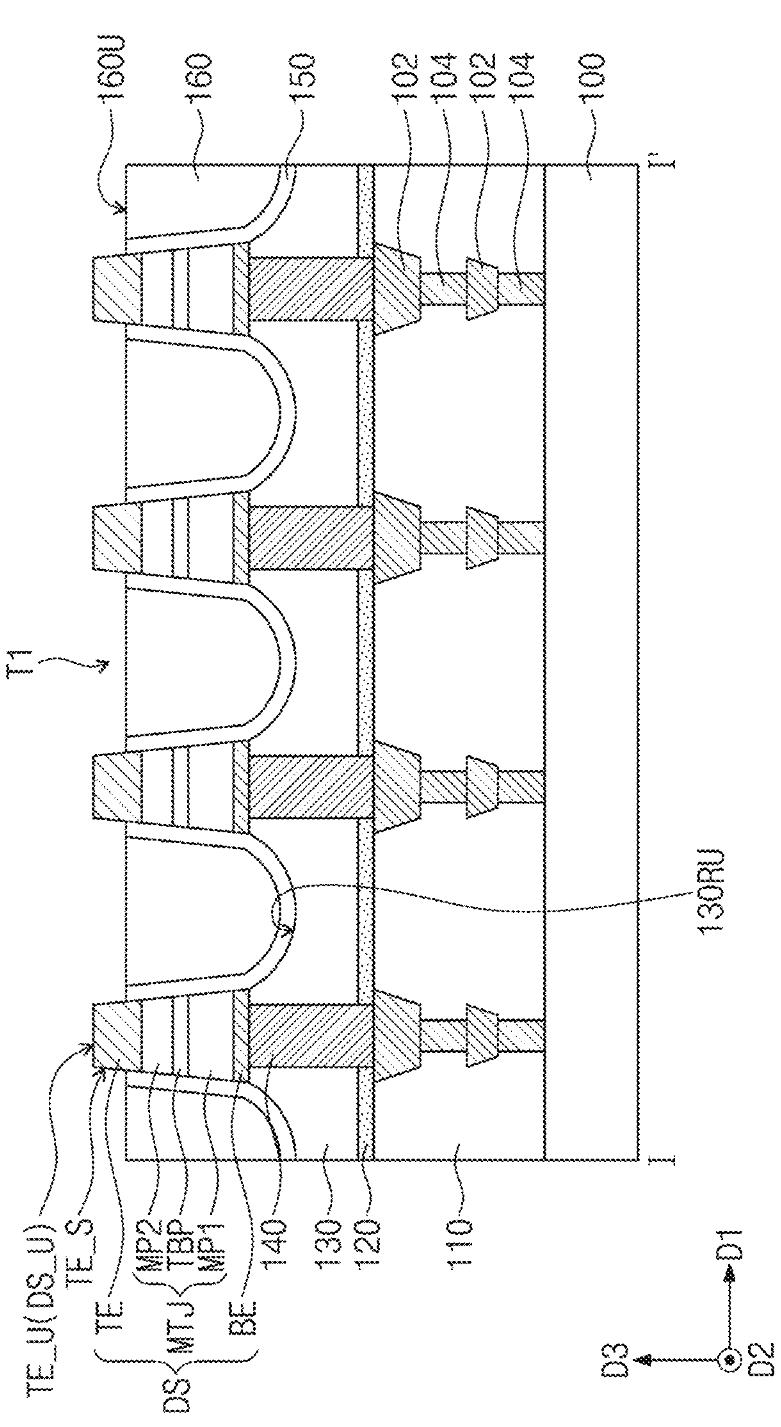

Referring to FIG. 12, a first trench T1 may be formed to pass through upper portions of the upper insulating layer 160 and the capping insulating layer 150. The first trench T1 may have a line shape extending in the first direction D1. The first trench T1 may expose upper surfaces DS_U of the data storage patterns DS spaced apart from each other in the first direction D1. Upper surfaces DS_U of the data storage patterns DS may correspond to upper surfaces TE_U of the upper electrodes TE. According to some example embodiments, the first trench T1 may expose upper side surfaces TE_S of the upper electrodes TE. In this case, the upper surfaces DS_U of the data storage patterns DS (that is, the upper surfaces TE_U of the upper electrodes TE) may be positioned at a height higher than the upper surface 160U of the upper insulating layer 160U.

Figure 13:
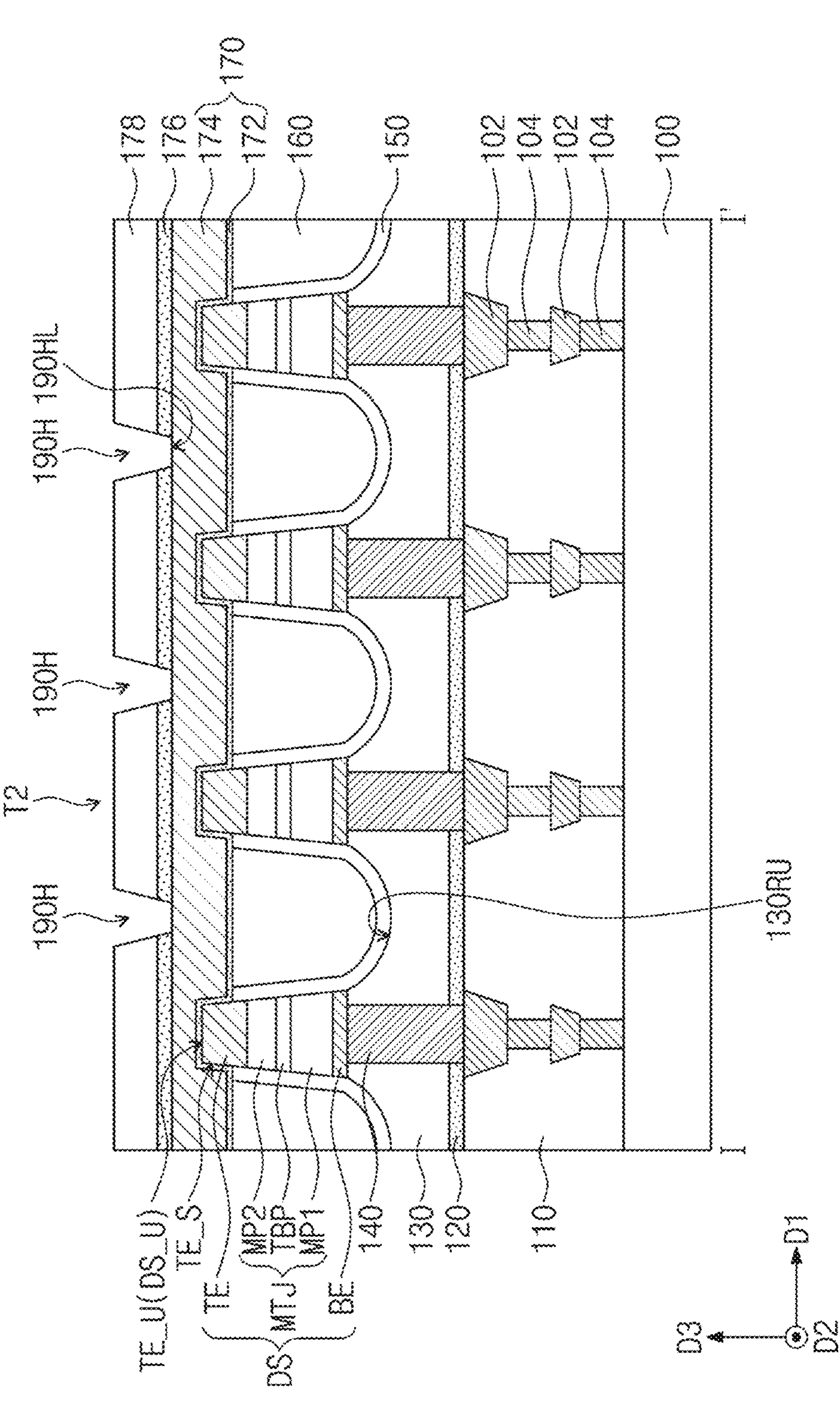

Referring to FIG. 13, a first upper conductive line 170 may be formed in the first trench T1 and may extend in the first direction D1. The first upper conductive line 170 may include a first conductive pattern 174 extending in the first direction D1 and a first barrier pattern 172 extending along a bottom surface of the first conductive pattern 174. Forming the first upper conductive line 170 may include forming a first barrier layer on the upper insulating layer 160 to partially fill the first trench T1, forming a first conductive layer filling a remaining portion of the first trench T1, and planarizing the first conductive layer and the first barrier layer, e.g., with a chemical mechanical planarization (CMP) process. By the planarization process, the first barrier pattern 172 and the first conductive pattern 174 may be locally formed in the first trench T1.

The first upper conductive line 170 may be connected to the upper electrodes TE of the data storage patterns DS spaced apart from each other in the first direction D1. The first upper conductive line 170 may be formed to cover the upper surfaces TE_U and upper side surfaces TE_S of the upper electrodes TE.

A second protective insulating layer 176 and an upper interlayer insulating layer 178 may be sequentially formed on the first upper conductive line 170. A second trench T2 may be formed to pass through an upper portion of the upper interlayer insulating layer 178. The second trench T2 may have a line shape extending in the first direction D1. Via holes 190H may be formed to be spaced apart from each other along the bottom surface of the second trench T2 in the first direction D1. Each of the via holes 190H may pass through a lower portion of the upper interlayer insulating layer 178 and the second protective insulating layer 176 and may expose an upper surface of the first upper conductive line 170.

The via holes 190H may be formed to be offset in the first direction D1 from the data storage patterns DS spaced apart from each other in the first direction D1. Each of the via holes 190H may be formed on the first upper conductive line 170 between a pair of data storage patterns DS immediately adjacent to each other in the first direction D1. The bottom surfaces 190HL of the via holes 190H may not vertically (e.g., in the third direction D3) overlap upper surfaces DS_U (i.e., the upper surface TE_U of the upper electrode TE) of the data storage patterns DS. The bottom surface 190HL of each of the via holes 190H may overlap the upper insulating layer 160 between the pair of data storage patterns DS in the third direction D3, and may overlap the recessed upper surface 130RU of the lower insulating layer 130 between the pair of data storage patterns DS in the third direction D3.

The via holes 190H may be formed by an etching process of etching the upper interlayer insulating layer 178 and the second protective insulating layer 176 exposed by the bottom surface of the second trench T2. During the etching process for forming the via holes 190H, the first upper conductive line 170 exposed by the bottom surfaces 190HL of the via holes 190H may be recessed.

When the bottom surfaces 190HL of the via holes 190H vertically (e.g., in the third direction D3) overlap the upper surfaces DS_U (i.e., the upper surfaces TE_U of the upper electrodes TE) of the data storage patterns DS, the first upper conductive line 170 may be recessed during the etching process, and upper portions of the data storage patterns DS (e.g., the upper electrodes TE) may be etched. Accordingly, defects of the data storage patterns DS may occur.

According to various example embodiments, however, the via holes 190H may be formed to be offset in the first direction D1 from the data storage patterns DS spaced apart from each other in the first direction D1. The bottom surfaces 190HL of the via holes 190H may not vertically (e.g., in the third direction D3) overlap the upper surfaces DS_U (i.e., the upper surfaces TE_U of the upper electrodes TE) of the data storage patterns DS. Accordingly, even when the first upper conductive line 170 exposed by the bottom surfaces 190HL of the via holes 190H is recessed during the etching process for forming the via holes 190H, the upper portions (e.g., the upper electrodes TE) of the data storage patterns DS may not be etched. As a result, defects of the data storage patterns DS may be prevented or reduced in likelihood of occurrence and/or in impact from occurrence. Accordingly, a semiconductor device including the data storage patterns DS may be more easily manufactured, and defects of the semiconductor device may be reduced or minimized.

Referring back to FIG. 3, a plurality of via contacts 190 may be formed to fill the via holes 190H, and a second upper conductive line 180 may be formed to fill the second trench T2. The second upper conductive line 180 may include a second conductive pattern 184 extending in the first direction D1 and a second barrier pattern 182 extending along a bottom surface of the second conductive pattern 184. Each of the plurality of via contacts 190 may include a contact pattern 194 passing through the upper interlayer insulating layer 178 and the second protective insulating layer 176 and a contact barrier pattern 192 extending along a side surface and bottom surface of the contact pattern 194.

Forming the plurality of via contacts 190 and the second upper conductive line 180 may include, for example, forming a second barrier layer on the upper interlayer insulating layer 178 to fill a portion of the second trench T2 and a portion of each of the via holes 190H, forming a second conductive layer filling a remaining portion of the second trench T2 a remaining portion of each of the via holes 190H, and planarizing (e.g., with a CMP planarization process) the second conductive layer and the second barrier layer. The contact barrier pattern 192 and the contact pattern 194 may be formed in each of the via holes 190H by the planarization process, and the second barrier pattern 182 and the second conductive pattern 184 may be locally formed in the second trench T2. In some example embodiments, the forming the second conductive layer may include performing an electrochemical deposition, e.g., a plating process including copper; however, example embodiments are not limited thereto.

According to some example embodiments, the contact pattern 194 and the second conductive pattern 184 may be integrally connected to each other without a boundary, and the contact barrier pattern 192 and the second barrier pattern 182 may be integrally connected to each other without a boundary.

The second upper conductive line 180 may be electrically connected to the first upper conductive line 170 through the plurality of via contacts 190. The first upper conductive line 170, the second upper conductive line 180, and the plurality of via contacts 190 may configure the bit line BL of FIG. 1.

According to various example embodiments, as the bit line BL includes the first upper conductive line 170 and the second upper conductive line 180 connected in parallel to each other, resistance of the bit line BL may be reduced. Accordingly, electrical characteristics of the semiconductor device may be improved.

According to various example embodiments, the bottom surfaces of the plurality of via contacts may not overlap the upper surfaces of the data storage patterns in the vertical direction perpendicular to the upper surface of the substrate. Accordingly, the upper electrodes of the data storage patterns may not be etched or inadvertently etched while forming the via holes in which the plurality of via contacts are formed. As a result, the defects of the data storage patterns may be prevented or reduced in likelihood of occurrence and/or in impact from occurrence. Accordingly, the semiconductor device including the data storage patterns may be easily manufactured, and the defects of the semiconductor device may be minimized or reduced.

Alternatively or additionally, the bit lines connected to the data storage patterns may include the first upper conductive line, the second upper conductive line, and the plurality of via contacts therebetween. In this case, as the bit line includes the first upper conductive line and the second upper conductive line connected in parallel to each other, the resistance of the bit line may be reduced. Accordingly, the electrical characteristics of the semiconductor device may be improved.

While various example embodiments are described above, a person of ordinary skill in the art may understand that many modifications and variations are made without departing from the spirit and scope of the present disclosure defined in the following claims. Accordingly, example embodiments should be considered in all respects as illustrative and not restrictive, with the spirit and scope of the present disclosure being indicated by the appended claims. Additionally example embodiments are not necessarily mutually exclusive with one another. For example, some example embodiments may include one or more features described with reference to one or more figures, and may also include one or more other features described with reference to one or more other figures.

What is claimed is:

1. A semiconductor device comprising:

a plurality of data storage patterns on a substrate, the plurality of data storage patterns spaced apart from each other in a first direction parallel to an upper surface of the substrate;

a first upper conductive line on and above the plurality of data storage patterns, the first upper conductive line extending in the first direction and connected to the plurality of data storage patterns;

a second upper conductive line on and above the first upper conductive line and extending in the first direction; and a plurality of via contacts between the first upper conductive line and the second upper conductive line and spaced apart from each other in the first direction, wherein the second upper conductive line is connected to the first upper conductive line through the plurality of via contacts, the plurality of via contacts are offset from the plurality of data storage patterns in the first direction between the first upper conductive line and the second upper conductive line, each of the plurality of data storage patterns includes an upper electrode, and the first upper conductive line includes a barrier pattern on upper surfaces of and on side surfaces of the upper electrodes of the plurality of data storage patterns.

2. The semiconductor device of claim 1, wherein each of the plurality of via contacts is between a pair of data storage patterns immediately adjacent to each other in the first direction from among the plurality of data storage patterns, when viewed in a plan view.

3. The semiconductor device of claim 1, wherein bottom surfaces of the plurality of via contacts do not overlap upper surfaces of the plurality of data storage patterns in a direction perpendicular to the upper surface of the substrate.

4. The semiconductor device of claim 1, wherein the plurality of data storage patterns include a first data storage pattern and a second data storage pattern immediately adjacent to each other in the first direction, a bottom surface of at least one of the plurality of via contacts is spaced apart from an upper surface of the first data storage pattern by a first distance in the first direction, and is spaced apart from an upper surface of the second data storage pattern by a second distance in a direction opposite to the first direction, and each of the first distance and the second distance is greater than zero.

5. The semiconductor device of claim 4, wherein the first distance and the second distance are different from each other.

6. The semiconductor device of claim 4, wherein the first distance and the second distance are equal to each other.

7. The semiconductor device of claim 1, wherein each of the plurality of data storage patterns includes a lower electrode, a magnetic tunnel junction pattern, and the upper electrode that are sequentially stacked in a vertical direction perpendicular to the upper surface of the substrate, the first upper conductive line is connected to the upper electrodes of the plurality of data storage patterns.

8. The semiconductor device of claim 7, wherein bottom surfaces of the plurality of via contacts are spaced apart from upper surfaces of the upper electrodes in the first direction.

9. The semiconductor device of claim 8, wherein the bottom surfaces of the plurality of via contacts do not overlap the upper surfaces of the upper electrodes in the vertical direction.

10. The semiconductor device of claim 7, wherein the first upper conductive line at least partially covers an upper surface and an upper side surface of each of the upper electrodes.

11. The semiconductor device of claim 10, wherein a first thickness of the first upper conductive line in the vertical direction is smaller than a second thickness of the second upper conductive line in the vertical direction.

12. The semiconductor device of claim 7, further comprising:

a wiring structure between the substrate and the plurality of data storage patterns;

a lower insulating layer between the wiring structure and the plurality of data storage patterns; and lower electrode contacts disposed in the lower insulating layer, wherein the lower electrode contacts are respectively under the plurality of data storage patterns, and electrically connect the plurality of data storage patterns to wiring lines in the wiring structure, respectively.

13. A semiconductor device comprising:

a first data storage pattern and a second data storage pattern on a substrate and spaced apart from each other in a first direction parallel to an upper surface of the substrate;

an upper insulating layer between the first data storage pattern and the second data storage pattern;

a first upper conductive line on the upper insulating layer, extending in the first direction, and connected to and above the first data storage pattern and to the second data storage patterns;

a second upper conductive line extending in the first direction on and above the first upper conductive line; and a via contact between the first upper conductive line and the second upper conductive line, wherein a bottom surface of the via contact overlaps the upper insulating layer between the first data storage pattern and the second data storage pattern in a vertical direction perpendicular to the upper surface of the substrate, and the first upper conductive line includes a barrier pattern on a top surface of and on side surfaces of an upper electrode of each of the first data storage pattern and the second data storage pattern.

14. The semiconductor device of claim 13, wherein each of the first data storage pattern and the second data storage pattern includes a lower electrode, a magnetic tunnel junction pattern, and an upper electrode sequentially stacked in the vertical direction, and the first upper conductive line is connected to the upper electrode of each of the first data storage pattern and the second data storage pattern.

15. The semiconductor device of claim 14, wherein the bottom surface of the via contact is spaced apart from an upper surface of the upper electrode of the first data storage pattern in the first direction, and is spaced apart from an upper surface of the upper electrode of the second data storage pattern in a direction opposite to the first direction.

16. The semiconductor device of claim 14, wherein the bottom surface of the via contact does not overlap the upper surface of each of the upper electrodes of the first data storage pattern and the second data storage pattern in the vertical direction.

17. The semiconductor device of claim 14, further comprising:

a lower insulating layer on the substrate, wherein the first data storage pattern, the second data storage pattern, and the upper insulating layer are on the lower insulating layer, the lower insulating layer has an upper surface recessed toward the substrate between the first data storage pattern and the second data storage pattern, and the bottom surface of the via contact overlaps the recessed upper surface of the lower insulating layer in the vertical direction.

18. The semiconductor device of claim 17, further comprising:

a wiring structure between the substrate and the lower insulating layer; and lower electrode contacts disposed in the lower insulating layer, wherein the lower electrode contacts are under the first data storage pattern and the second data storage patterns, respectively, and electrically connect the first data storage pattern and the second data storage pattern to wiring lines in the wiring structure, respectively.

19. The semiconductor device of claim 14, wherein the first upper conductive line covers an upper surface and the upper side surface of the upper electrode of each of the first data storage pattern and the second data storage pattern.

20. The semiconductor device of claim 14, wherein a first thickness of the first upper conductive line in the vertical direction is smaller than a second thickness of the second upper conductive line in the vertical direction.

* * * * *